United States Patent
Sakamoto

(10) Patent No.: US 10,572,608 B2
(45) Date of Patent: Feb. 25, 2020

(54) DATA DRIVEN SHRINKAGE COMPENSATION

(71) Applicant: INTERNATIONAL BUSINESS MACHINES CORPORATION, Armonk, NY (US)

(72) Inventor: Masaharu Sakamoto, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/026,554

(22) Filed: Jul. 3, 2018

(65) Prior Publication Data

US 2018/0330019 A1    Nov. 15, 2018

Related U.S. Application Data

(63) Continuation of application No. 14/831,895, filed on Aug. 21, 2015, now Pat. No. 10,078,711.

(51) Int. Cl.
*G06F 17/50* (2006.01)
*G06F 15/00* (2006.01)

(52) U.S. Cl.
CPC .............. *G06F 17/50* (2013.01); *G06F 15/00* (2013.01)

(58) Field of Classification Search
CPC .......... G06F 17/50; G06F 19/00; G06F 17/00; G06F 17/5018
USPC .................................. 345/149, 418, 419, 428
See application file for complete search history.

(56) References Cited

U.S. PATENT DOCUMENTS

| 4,622,593 A * | 11/1986 | Curry ................. G02B 27/0031 |
| | | 358/410 |
| 7,369,915 B2 | 5/2008 | Kritchman et al. |
| 10,336,055 B2 | 7/2019 | Das et al. |
| 2014/0107823 A1 | 4/2014 | Huang |
| 2015/0088292 A1 | 3/2015 | Inoue et al. |
| 2016/0368220 A1 | 12/2016 | Dimatteo et al. |
| 2018/0086001 A1 | 3/2018 | Kim et al. |

OTHER PUBLICATIONS

Johnson, et al., "Benchmarking Evaluation of an Open Source Fused Deposition Modeling Additive Manufacturing System", International Solid Freeform Fabrication Symposium, Aug. 2011, pp. 197-211.

(Continued)

*Primary Examiner* — Han Yang
(74) *Attorney, Agent, or Firm* — Tutunjian & Bitetto, P.C.; Vazken Alexanian

(57) ABSTRACT

A method and system are provided for data driven shrinkage compensation. The method includes calculating, by at least one processor operatively coupled to a memory device, one or more dimensions of an object modeled in a file from one or more directional strands disposed between facets of one or more predetermined facet pairs. The method further includes predicting, by the processor, dimensional changes in the one or more directional strands as a result of the fabrication of the object using an additive manufacturing process based on a shape shrinkage model. The method further includes correcting, by the processor, coordinate data of at least one facet of the one or more predetermined facet pairs to compensate for the one or more predicted dimensional changes in the one or more directional strands.

20 Claims, 11 Drawing Sheets

(56) References Cited

OTHER PUBLICATIONS

Huang, et al., "Optimal Offline Compensation of Shape Shrinkage for 3D Printing Processes", IIE Transactions Oct. 2014, pp. 1-24.
List of IBM Patents or Patent Applications Treated as Related dated Jul. 3, 2018, 2 pages.

* cited by examiner

DATA DRIVEN SHRINKAGE COMPENSATION

BACKGROUND

Technical Field

The present invention relates generally to information processing and, in particular, to data driven shrinkage compensation.

Description of the Related Art

Three-dimensional (3D) printing, also known as Additive Manufacturing, has attracted considerable interest in the past few years. In contrast to the material removal processes of traditional machining, the 3D printing adds material layer by layer to construct 3D objects.

When fabricating a 3D object using a 3D printer, the process involves various disturbances that can cause dimensional errors. In order to reduce the dimensional errors, a 3D printer maker provides a guidance to modify the 3D shape uniformly, or technical experts often modify the shapes of the 3D CAD model based on their experiments and intuitions. However, the dimensional errors in the 3D printed object are not uniform. When the 3D shape is complicated, even experts are no longer able to correct the shape.

Thus, there is a need for an automatic shape modification method to compensate the dimensional errors in 3D printed objects.

SUMMARY

According to an aspect of the present principles, a method is provided for data driven shrinkage compensation. The method includes subdividing, by a polygon subdivider, polygons in a three-dimensional file into facets. The method further includes calculating, by an axis dimension calculator, dimensions of an object in the three-dimensional file from an x-directional strand disposed between two facets of a first predetermined facet pair, a y-directional strand disposed between two facets of second predetermined facet pair, and a z-directional strand disposed between two facets of a third predetermined facet pair. The object is formed from at least some of the polygons. The method also includes predicting, by a dimension change predictor, dimensional changes in the x-directional strand, the y-directional strand, and the z-directional strand based on a shape shrinkage model. The method additionally includes correcting, by a dimension change compensator, x-coordinate data, y-coordinate data, and z-coordinate data of at least one facet of the predetermined facet pairs to compensate for the dimensional changes in the x-directional strand, the y-directional strand, and the z-directional strand.

According to another aspect of the present principles, a system is provided for data driven shrinkage compensation. The system includes a polygon subdivider for subdividing polygons in a three-dimensional file into facets. The system further includes an axis dimension calculator for calculating dimensions of an object in the three-dimensional file from an x-directional strand disposed between two facets of a first predetermined facet pair, a y-directional strand disposed between two facets of second predetermined facet pair, and a z-directional strand disposed between two facets of a third predetermined facet pair. The object is formed from at least some of the polygons. The system also includes a dimension change predictor for predicting dimensional changes in the x-directional strand, the y-directional strand, and the z-directional strand based on a shape shrinkage model. The system additionally includes a dimension change compensator for correcting x-coordinate data, y-coordinate data, and z-coordinate data of at least one facet of the predetermined facet pairs to compensate for the dimensional changes in the x-directional strand, the y-directional strand, and the z-directional strand.

According to yet another aspect of the present invention, a method is provided for data driven shrinkage compensation. The method includes calculating, by at least one processor operatively coupled to a memory, one or more dimensions of an object modeled in a file from one or more directional strands disposed between facets of one or more respective predetermined facet pairs. The method further includes predicting, by the processor, dimensional changes in the one or more directional strands as a result of the fabrication of the object using an additive manufacturing process based on a shape shrinkage model. The method further includes correcting, by the processor, coordinate data of at least one facet of the one or more predetermined facet pairs to compensate for the one or more predicted dimensional changes in the one or more directional strands.

According to yet another aspect of the present invention, a system is provided for data driven shrinkage compensation. The system includes a memory device having program instructions stored thereon, and at least one processor operatively coupled to the memory device. The processor is configured to execute program instructions stored on the memory device to calculate one or more dimensions of an object in a file from one or more directional strands disposed between facets of one or more respective predetermined facet pairs, predict dimensional changes in the one or more directional strands as a result of the fabrication of the object using an additive manufacturing process based on a shape shrinkage model, and correct coordinate data of at least one facet of the one or more predetermined facet pairs to compensate for the one or more dimensional changes in the one or more directional strands These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to data driven shrinkage compensation.

Figure 1:
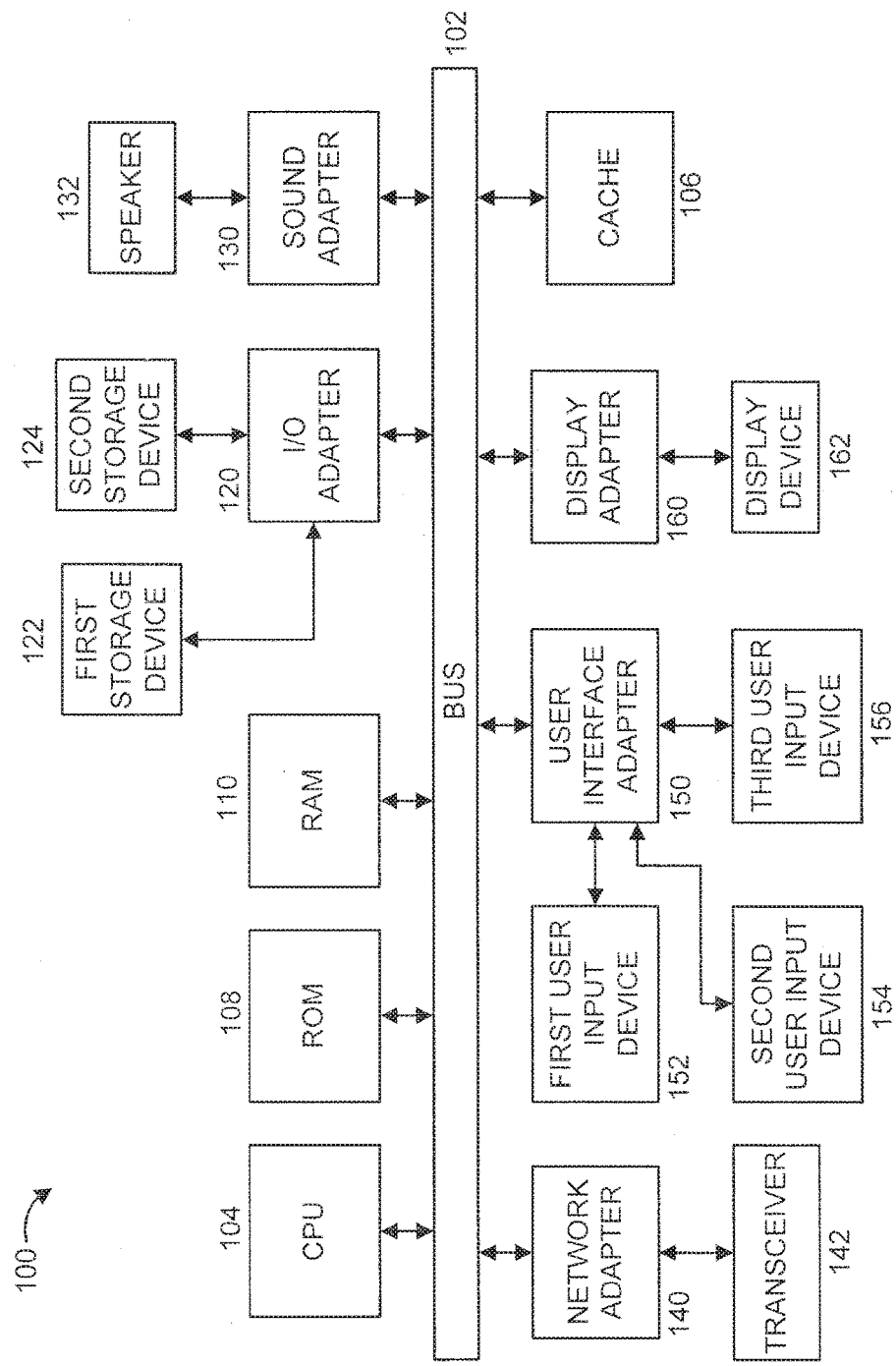
FIG. 1 shows an exemplary processing system 100 to which the present principles may be applied, in accordance with an embodiment of the present principles.

FIG. 1 shows an exemplary processing system 100 to which the present principles may be applied, in accordance with an embodiment of the present principles. The processing system 100 includes at least one processor (CPU) 104 operatively coupled to other components via a system bus 102. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input devices 152, 154, and 156 can be the same type of user input device or different types of user input devices. The user input devices 152, 154, and 156 are used to input and output information to and from system 100.

Of course, the processing system 100 may also include other elements (not shown), as readily contemplated by one of skill in the art, as well as omit certain elements. For example, various other input devices and/or output devices can be included in processing system 100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 100 are readily contemplated by one of ordinary skill in the art given the teachings of the present principles provided herein.

Figure 2:
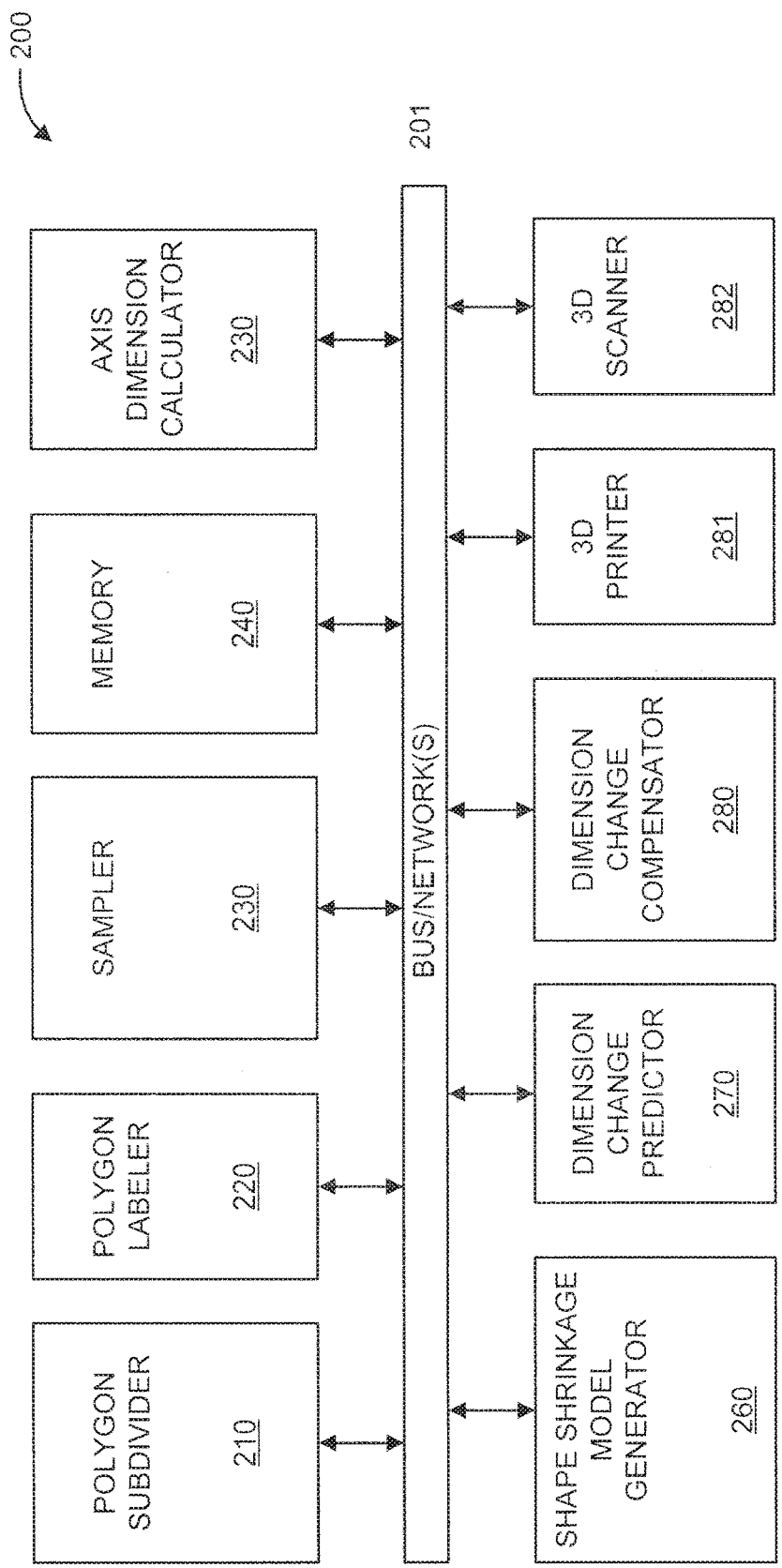
FIG. 2 shows an exemplary system 200 for data driven shrinkage compensation, in accordance with an embodiment of the present principles.

Moreover, it is to be appreciated that system 200 described below with respect to FIG. 2 is a system for implementing respective embodiments of the present principles. Part or all of processing system 100 may be implemented in one or more of the elements of system 200.

Figure 3:
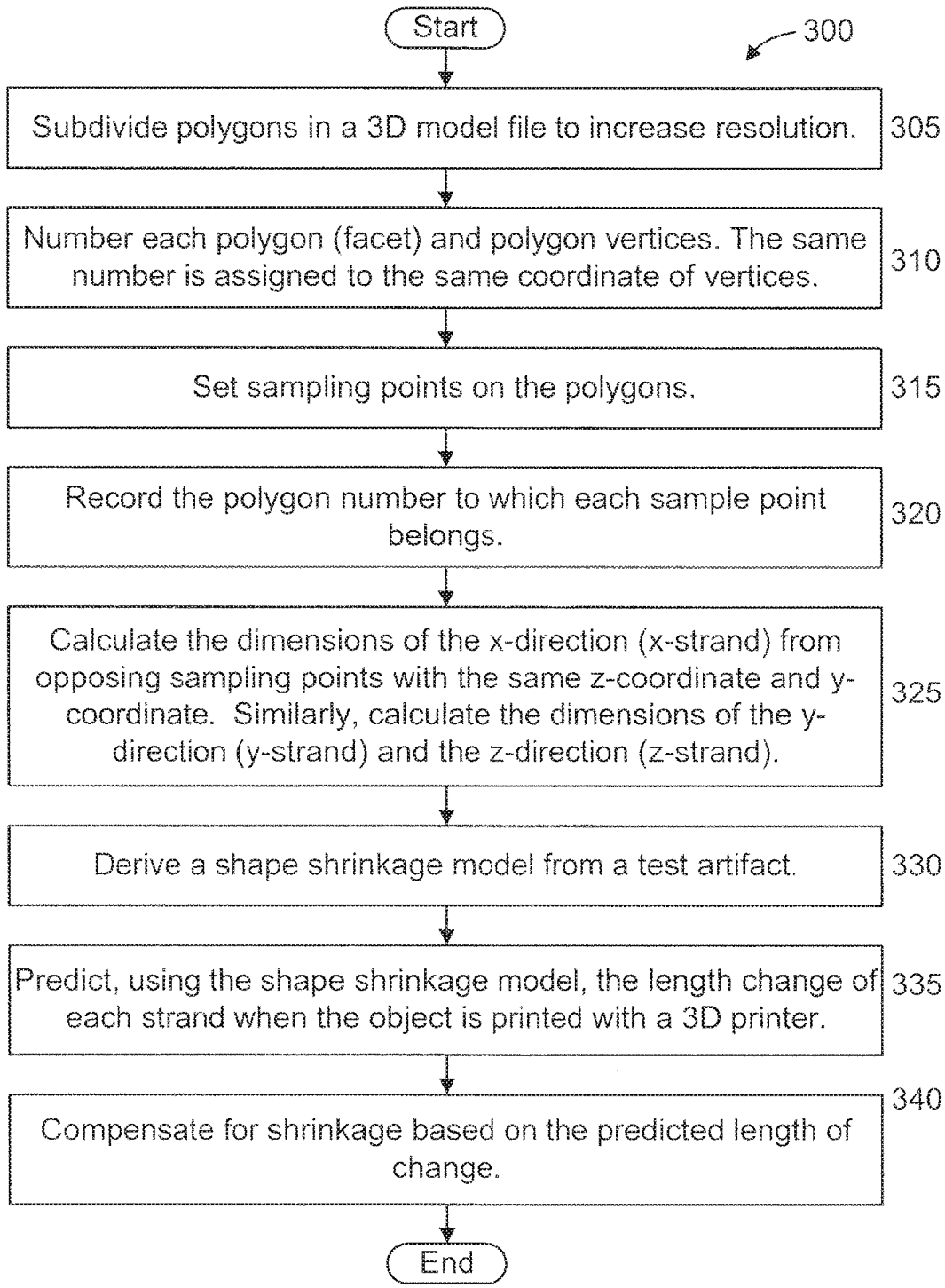
FIG. 3 shows an exemplary method 300 for data driven shrinkage compensation, in accordance with an embodiment of the present principles.
Figure 4:
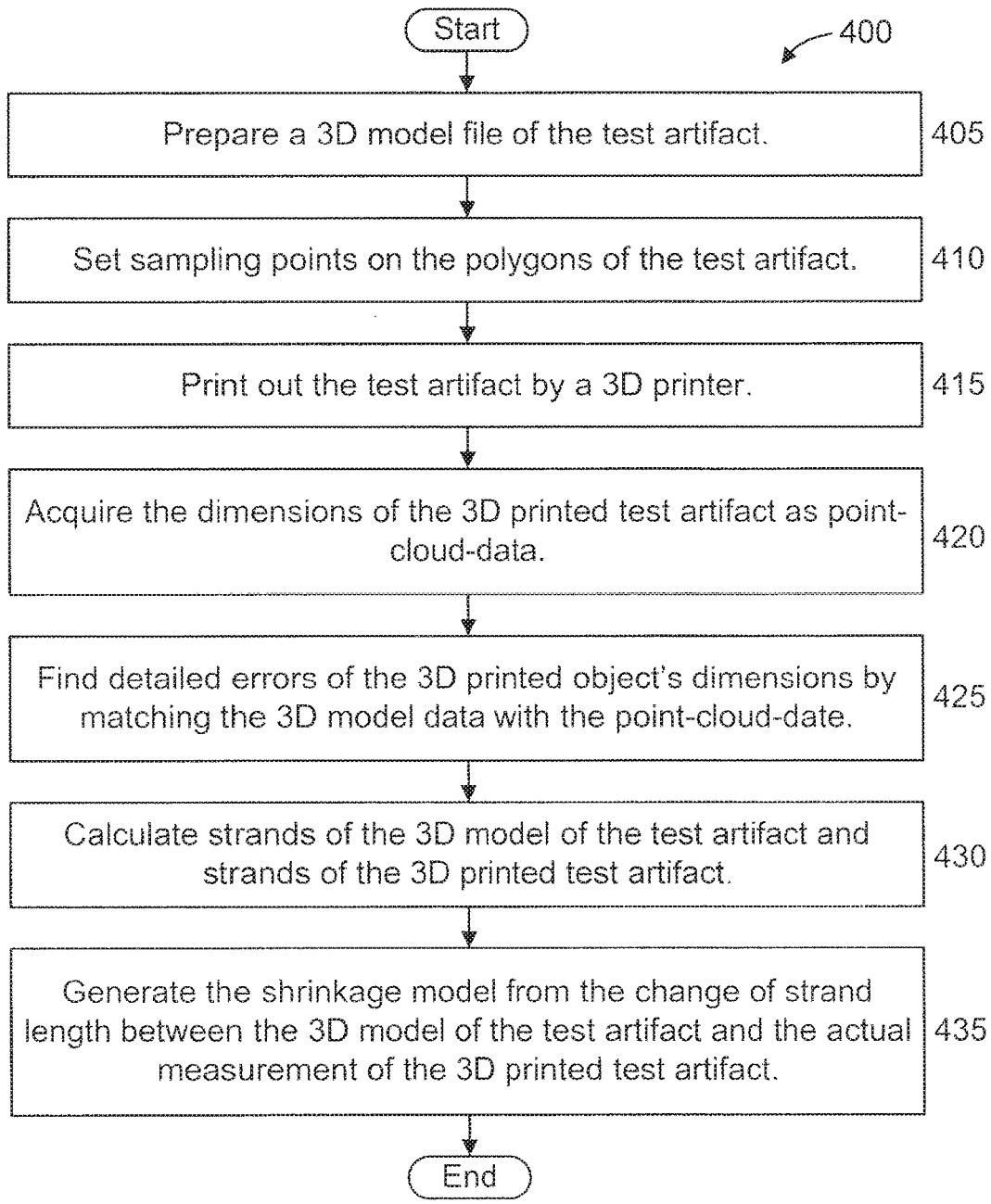
FIG. 4 shows an exemplary method 400 for building a shrinkage model, in accordance with an embodiment of the present principles.

Further, it is to be appreciated that processing system 100 may perform at least part of the method described herein including, for example, at least part of method 300 of FIG. 3 and/or at least part of method 400 of FIG. 4. Similarly, part or all of system 200 may be used to perform at least part of method 300 of FIG. 3 and/or at least part of method 400 of FIG. 4.

FIG. 2 shows an exemplary system 200 for data driven shrinkage compensation, in accordance with an embodiment of the present principles.

The system 200 includes a polygon subdivider 210, a polygon labeler 220, a sampler 230, a memory 240, an axis dimension calculator 250, a shape shrinkage model generator 260, a dimension change predictor 270, a dimension change compensator 280, a three-dimensional printer 281, and a three-dimensional scanner 282.

The polygon subdivider 210 subdivides polygons in a 3D model file to increase resolution. The 3D model can be, for example, in STereoLithography (STL) format, Additive Manufacturing File (AMF) format, and so forth.

The polygon labeler 220 numbers each polygon (facet) and polygon vertices. The same number is assigned to the same coordinate of vertices. The step makes the 3D model modification more efficient.

The sampler 230 sets sampling points on the polygons, and performs sampling of the polygons using the sampling points. In an embodiment, in order to set the sampling points automatically, the ray intersection algorithm or the point-in-polygon algorithm can be used. Of course, other sampling approaches can also be used, while maintaining the spirit of the present principles.

The memory 240 stores the polygon number to which each sample point belongs.

The axis dimension calculator 250 calculates the dimensions of the x-direction (x-strand), the y-direction (y-strand), and the z-direction (z-strand). In an embodiment, the x-direction (x-strand) is calculated from opposing sampling points with the same z-coordinate and y-coordinate, the y-direction (y-strand) is calculated from opposing sampling points with the same x-coordinate and z-coordinate, and the z-direction (z-strand) is calculated from opposing sampling points with the same x-coordinate and y-coordinate.

The shape shrinkage model generator 260 generates and/or otherwise derives a shape shrinkage model from a test artifact. Preferably, the test artifact has rich shape variations.

The dimension change predictor 270 predicts, using the shape shrinkage model, the length change of each strand when the object is printed with a 3D printer.

The dimension change compensator 280 compensates for changes in the shape. In an embodiment, for example, the vertices of polygons are moved so that the length change of strands is compensated. While shown separate from 3D printer 281, in an embodiment, the dimension change compensator 280 is included in the 3D printer.

The three-dimensional printer 281 prints out objects that have been compensated and test artifacts used to build the shape shrinkage model.

The three-dimensional scanner 282 scans objects and test artifacts. For example, a test artifact can be scanned in order to generate the shape shrinkage model from the scanned dimensions.

In the embodiment shown in FIG. 2, the elements thereof are interconnected by a bus/network(s) 201. However, in other embodiments, other types of connections can also be used. Moreover, in an embodiment, at least one of the elements of system 200 is processor-based. Further, while one or more elements may be shown as separate elements, in other embodiments, these elements can be combined as one element. The converse is also applicable, where while one or more elements may be part of another element, in other embodiments, the one or more elements may be implemented as standalone elements. These and other variations of the elements of system 200 are readily determined by one of ordinary skill in the art, given the teachings of the present principles provided herein, while maintaining the spirit of the present principles.

FIG. 3 shows an exemplary method 300 for data driven shrinkage compensation, in accordance with an embodiment of the present principles.

At step 305, subdivide polygons in a 3D model file to increase resolution.

At step 310, number each polygon (facet) and polygon vertices. The same number is assigned to the same coordinate of vertices. The step makes the 3D model modification more efficient.

At step 315, set sampling points on the polygons.

At step 320, record the polygon number to which each sample point belongs.

At step 325, calculate the dimensions of the x-direction (x-strand) from opposing sampling points with the same z-coordinate and y-coordinate. Similarly, calculate the dimensions of the y-direction (y-strand) and the z-direction (z-strand).

At step 330, derive a shape shrinkage model from a test artifact.

At step 335, predict, using the shape shrinkage model, the length change of each strand when the object is printed with a 3D printer.

At step 340, compensate for shrinkage based on the predicted length of change (per step 335). For example, move the vertices of polygons so that the length change of strands are compensated.

In an embodiment, the polygons which belong to both ends of the strand are identified. When it is predicted that the length of the strand shrinks Lc mm, each polygon moves Lc/2 mm so that the shrinkage of the strand is compensated.

While Lc/2 was used as an example, it is to be appreciated that the present principles are not limited to the same. For example, in an embodiment, movements of (Lc/3 and 2Lc/3), and so forth can also be used in accordance with the teachings of the present principles, while maintaining the spirit of the present principles. Thus, in the preceding case, one polygon is moved LC/3 and the other polygon is moved 2LC/3. In other embodiments, other values can be used.

FIG. 4 shows an exemplary method 400 for building a shrinkage model, in accordance with an embodiment of the present principles.

At step 405, prepare a 3D model file of the test artifact.

At step 410, set sampling points on the polygons of the test artifact (with the same procedure as in method 300).

At step 415, print out the test artifact by a 3D printer.

At step 420, acquire the dimensions of the 3D printed test artifact as point-cloud-data. In an embodiment, the dimensions are acquired using a commercially available 3D scanning system.

At step 425, find detailed errors of the 3D printed object's dimensions by matching the 3D model data with the point-cloud-date. In an embodiment, step 425 can be performed using CAT software.

At step 430, calculate strands of the 3D model of the test artifact and strands of the 3D printed test artifact as in method 300.

At step 435, generate the shrinkage model from the change of strand length between the 3D model of the test artifact and the actual measurement of the 3D printed test artifact.

In an embodiment, the shrinkage model can be built using any mathematical shrinkage prediction method including, but not limited to, kernel regression, neural network, and deep learning. The accuracy of the shrinkage model may be made more precise by adding more datasets.

Figure 5:
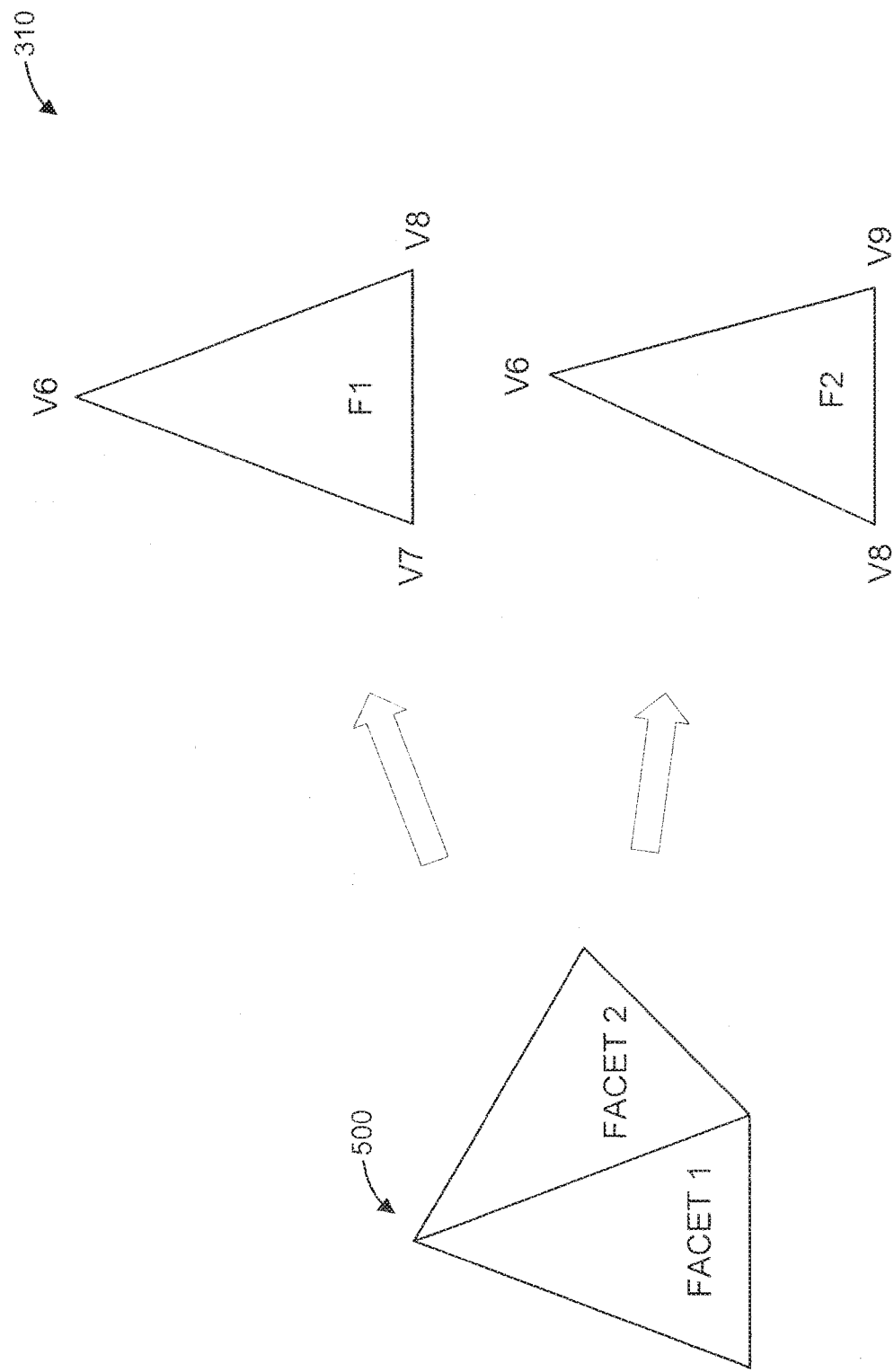
FIG. 5 further shows steps 310 of method 300 of FIG. 3, in accordance with an embodiment of the present principles.

FIG. 5 further shows steps 310 of method 300 of FIG. 3, in accordance with an embodiment of the present principles. Each facet (Facet 1, Facet 2) of a polygon 500 as shown on the left side is labeled with a facet number and vertice numbers as shown on the right side. In particular, the letter "F" followed by an integer (i.e., F1, F2) denotes a facet number, and the letter "v" followed by an integer (i.e., v6, v7, v8, v9) denotes a vertice number.

Figure 6:
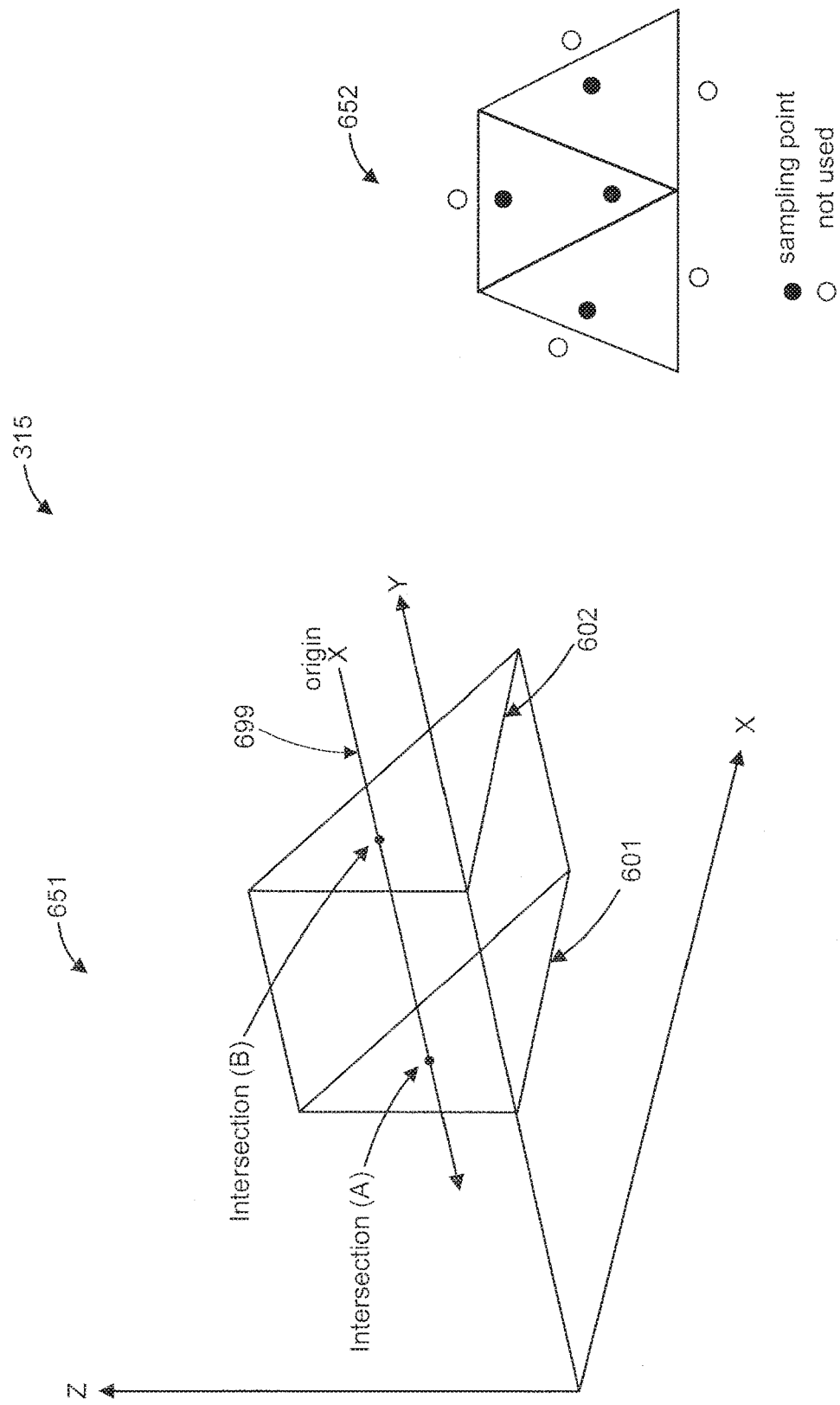
FIG. 6 further shows step 315 of method 300 of FIG. 3, in accordance with an embodiment of the present principles.

FIG. 6 further shows step 315 of method 300 of FIG. 3, in accordance with an embodiment of the present principles.

The left side of FIG. 6 shows a ray intersection method 651 for setting sampling points, and the right side of FIG. 6 shows a point-in-polygon method 652 for setting sampling points.

In the ray intersection method 651, the origin of a ray 699 is set. A point at the intersection of the ray 699 with a polygon is recorded. Here, the ray 699 intersects polygon 601 at intersection (A) and intersects polygon 602 at intersection (B). Thus, intersection (A) and intersection (B) are used as sampling points. In the ray intersection method 651, the origin of a ray 699 is set, and then the ray is projected in parallel to and along the x-direction, the y-direction, and the x-direction.

In the point-in-polygon method 652, sample point candidates are distributed in the 3D model. Then sample points in the polygons are chosen.

Figure 7:
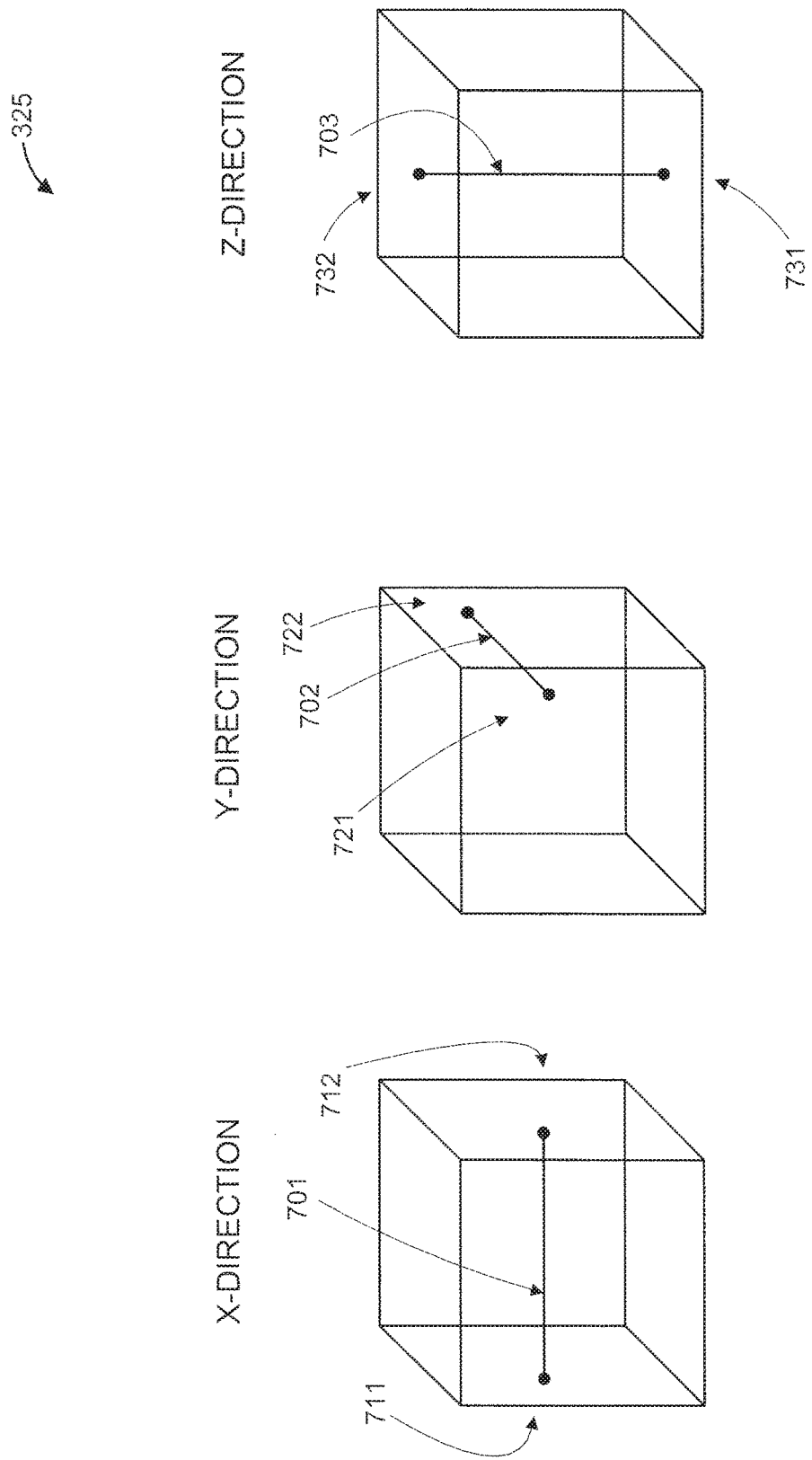
FIG. 7 further shows step 325 of method 300 of FIG. 3, in accordance with an embodiment of the present principles.

FIG. 7 further shows step 325 of method 300 of FIG. 3, in accordance with an embodiment of the present principles.

For the length of the X direction, an x-strand 701 having a same y-coordinate and z-coordinate is used. The x-strand 701 starts from a point on the left face 711 of the cube and ends on a point on the right face 712 of the cube, where both points have the same y-coordinate and z-coordinate. For the length of the Y direction, a y-strand 702 having a same x-coordinate and z-coordinate is used. The y-strand 702 starts from a point on the front face 721 of the cube and ends on a point on the back face 722 of the cube, where both points have the same x-coordinate and z-coordinate. For the length of the Z direction, a z-strand 703 having a same x-coordinate and y-coordinate is used. The x-strand 703 starts from a point on the bottom face 731 of the cube and ends on a point on the top face 732 of the cube, where both points have the same x-coordinate and y-coordinate.

Figure 8:
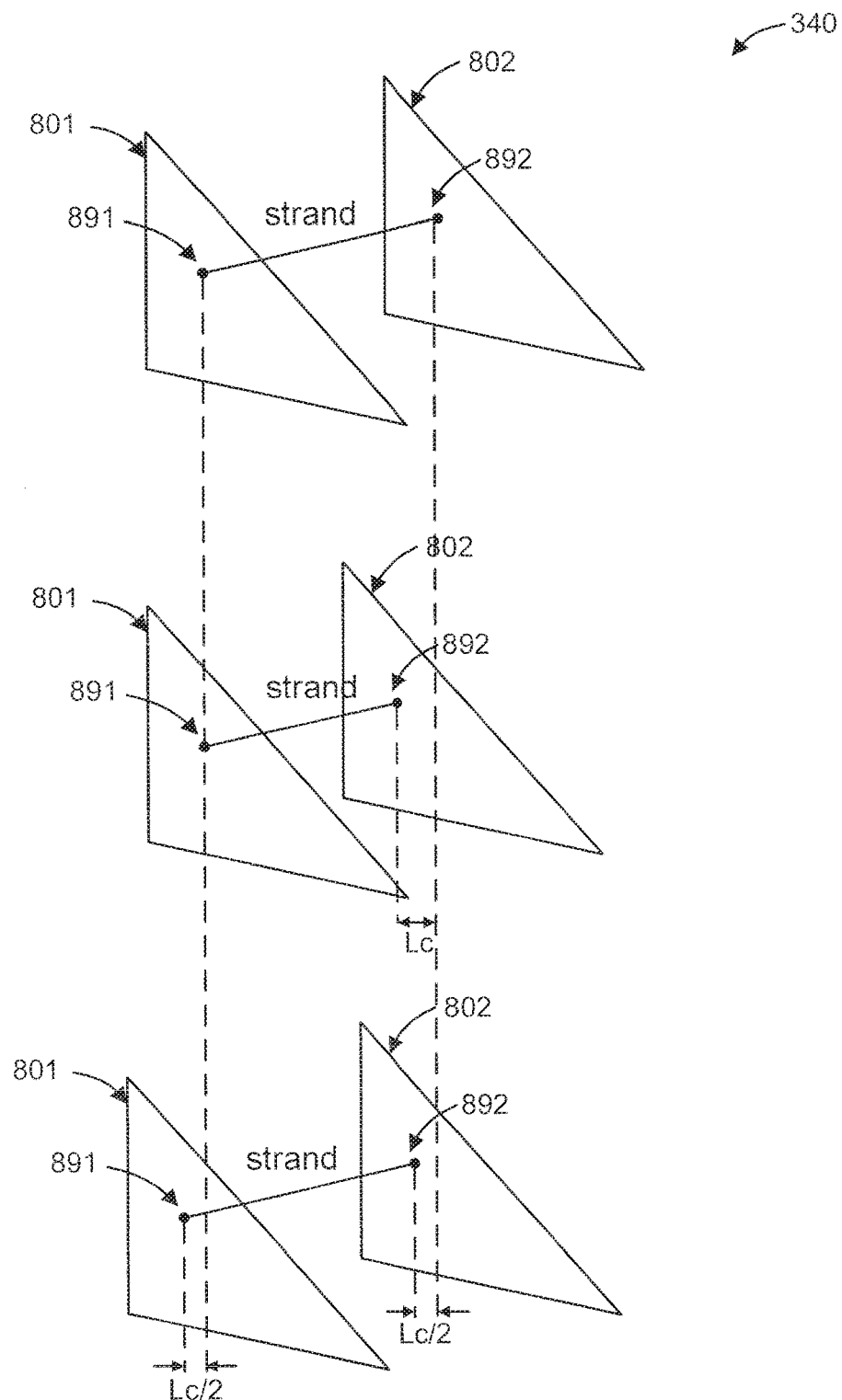
FIG. 8 further shows step 340 of method 300 of FIG. 3, in accordance with an embodiment of the present principles.

FIG. 8 further shows step 340 of method 300 of FIG. 3, in accordance with an embodiment of the present principles. The top-most pair of polygons are from the 3D model, the middle pair of polygons are from the 3D printed object, and the bottom-most pair of polygons are the shrinkage compensated polygons from the 3d model. The example of FIG. 8 relates to the case where the polygons 801 and 802 which belong to both ends of the strand are identified, and for a prediction that the length of the strand shrinks Lc mm, each polygon 801 and 802 moves Lc/2 mm so that the shrinkage of the strand is compensated. Sampling point 891 is on polygon 801 and sampling point 892 is on polygon 802.

Again it is noted that while Lc/2 was used as an example, the present principles are not limited to the same. For example, in an embodiment, movements of Lc/3, 2Lc/3, and so forth can also be used in accordance with the teachings of the present principles, while maintaining the spirit of the present principles.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load balancing between clouds).

A cloud computing environment is service oriented with a focus on statelessness, low coupling, modularity, and semantic interoperability. At the heart of cloud computing is an infrastructure comprising a network of interconnected nodes.

Figure 9:
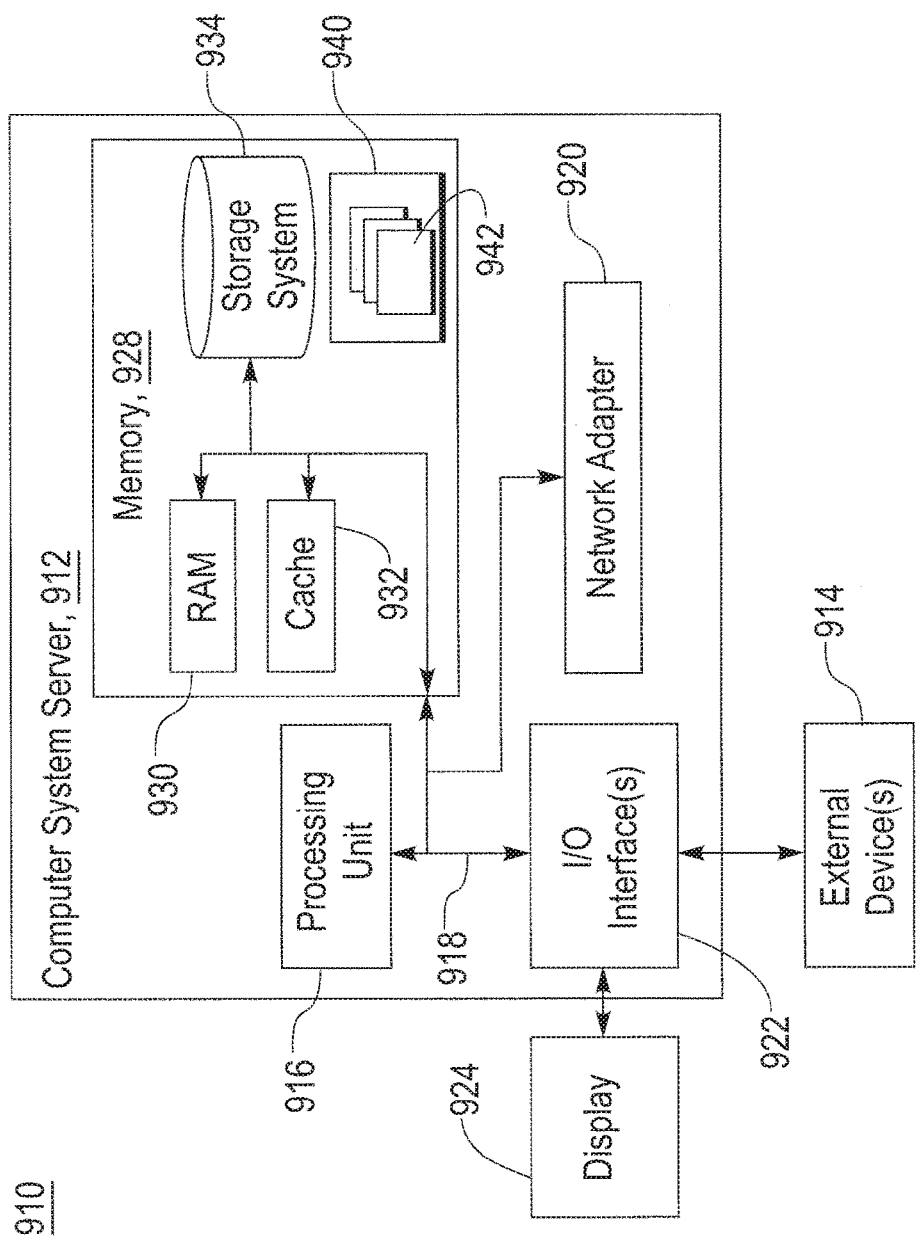
FIG. 9 shows an exemplary cloud computing node 910, in accordance with an embodiment of the present principles.

Referring now to FIG. 9, a schematic of an example of a cloud computing node 910 is shown. Cloud computing node 910 is only one example of a suitable cloud computing node and is not intended to suggest any limitation as to the scope of use or functionality of embodiments of the invention described herein. Regardless, cloud computing node 910 is capable of being implemented and/or performing any of the functionality set forth hereinabove.

In cloud computing node 910 there is a computer system/server 912, which is operational with numerous other general purpose or special purpose computing system environments or configurations. Examples of well-known computing systems, environments, and/or configurations that may be suitable for use with computer system/server 912 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 912 may be described in the general context of computer system executable instructions, such as program modules, being executed by a computer system. Generally, program modules may include routines, programs, objects, components, logic, data structures, and so on that perform particular tasks or implement particular abstract data types. Computer system/server 912 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, computer system/server 912 in cloud computing node 910 is shown in the form of a general-purpose computing device. The components of computer system/server 912 may include, but are not limited to, one or more processors or processing units 916, a system memory 928, and a bus 918 that couples various system components including system memory 928 to processor 916.

Bus 918 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 912 typically includes a variety of computer system readable media. Such media may be any available media that is accessible by computer system/server 912, and it includes both volatile and non-volatile media, removable and non-removable media.

System memory 928 can include computer system readable media in the form of volatile memory, such as random access memory (RAM) 930 and/or cache memory 932. Computer system/server 912 may further include other removable/non-removable, volatile/non-volatile computer system storage media. By way of example only, storage system 934 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 918 by one or more data media interfaces. As will be further depicted and described below, memory 928 may include at least one program product having a set (e.g., at least one) of program modules that are configured to carry out the functions of embodiments of the invention.

Program/utility 940, having a set (at least one) of program modules 942, may be stored in memory 928 by way of example, and not limitation, as well as an operating system, one or more application programs, other program modules, and program data. Each of the operating system, one or more application programs, other program modules, and program data or some combination thereof, may include an implementation of a networking environment. Program modules 942 generally carry out the functions and/or methodologies of embodiments of the invention as described herein.

Computer system/server 912 may also communicate with one or more external devices 914 such as a keyboard, a pointing device, a display 924, etc.; one or more devices that enable a user to interact with computer system/server 912; and/or any devices (e.g., network card, modem, etc.) that enable computer system/server 912 to communicate with one or more other computing devices. Such communication can occur via Input/Output (I/O) interfaces 922. Still yet, computer system/server 912 can communicate with one or more networks such as a local area network (LAN), a general wide area network (WAN), and/or a public network (e.g., the Internet) via network adapter 920. As depicted, network adapter 920 communicates with the other components of computer system/server 912 via bus 918. It should be understood that although not shown, other hardware and/or software components could be used in conjunction with computer system/server 912. Examples, include, but are not limited to: microcode, device drivers, redundant processing units, external disk drive arrays, RAID systems, tape drives, data archival storage systems, etc.

Figure 10:
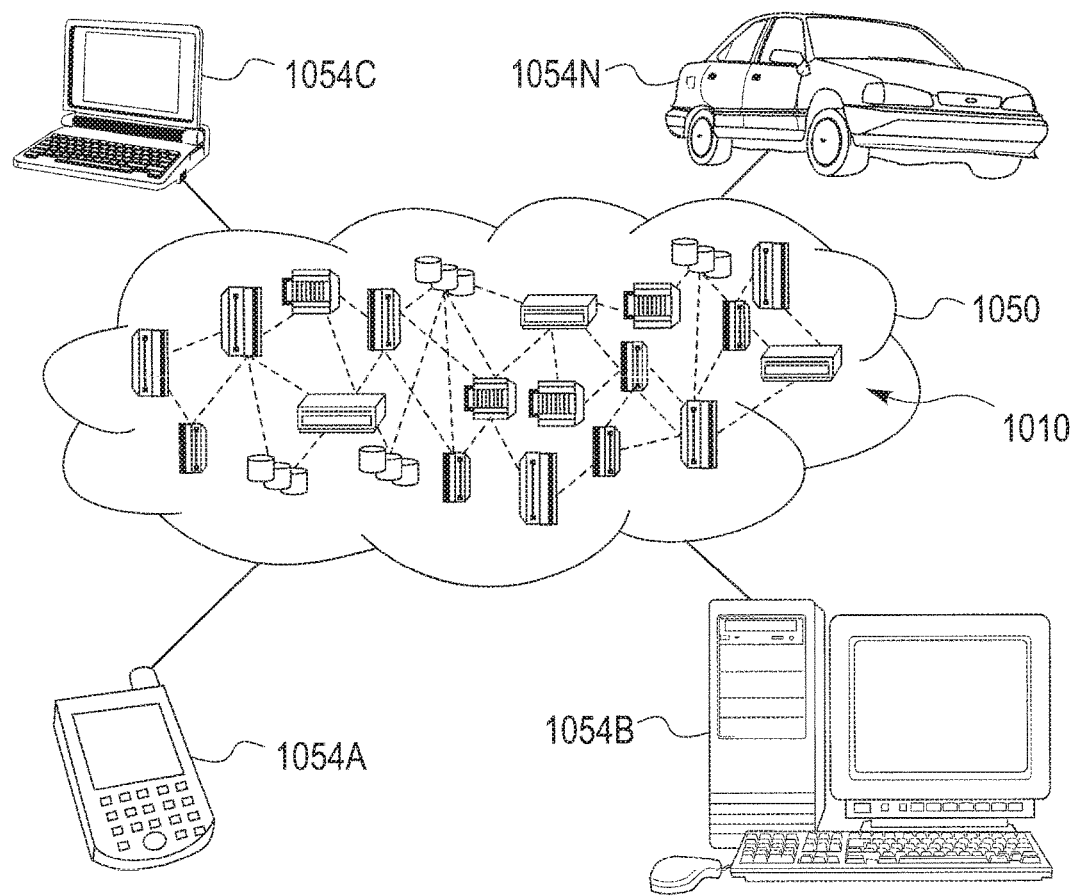
FIG. 10 shows an exemplary cloud computing environment 1050, in accordance with an embodiment of the present principles.

Referring now to FIG. 10, illustrative cloud computing environment 1050 is depicted. As shown, cloud computing environment 1050 comprises one or more cloud computing nodes 1010 with which local computing devices used by cloud consumers, such as, for example, personal digital assistant (PDA) or cellular telephone 1054A, desktop computer 1054B, laptop computer 1054C, and/or automobile computer system 1054N may communicate. Nodes 1010 may communicate with one another. They may be grouped (not shown) physically or virtually, in one or more networks, such as Private, Community, Public, or Hybrid clouds as described hereinabove, or a combination thereof. This allows cloud computing environment 1050 to offer infrastructure, platforms and/or software as services for which a cloud consumer does not need to maintain resources on a local computing device. It is understood that the types of computing devices 1054A-N shown in FIG. 10 are intended to be illustrative only and that computing nodes 1010 and cloud computing environment 1050 can communicate with any type of computerized device over any type of network and/or network addressable connection (e.g., using a web browser).

Figure 11:
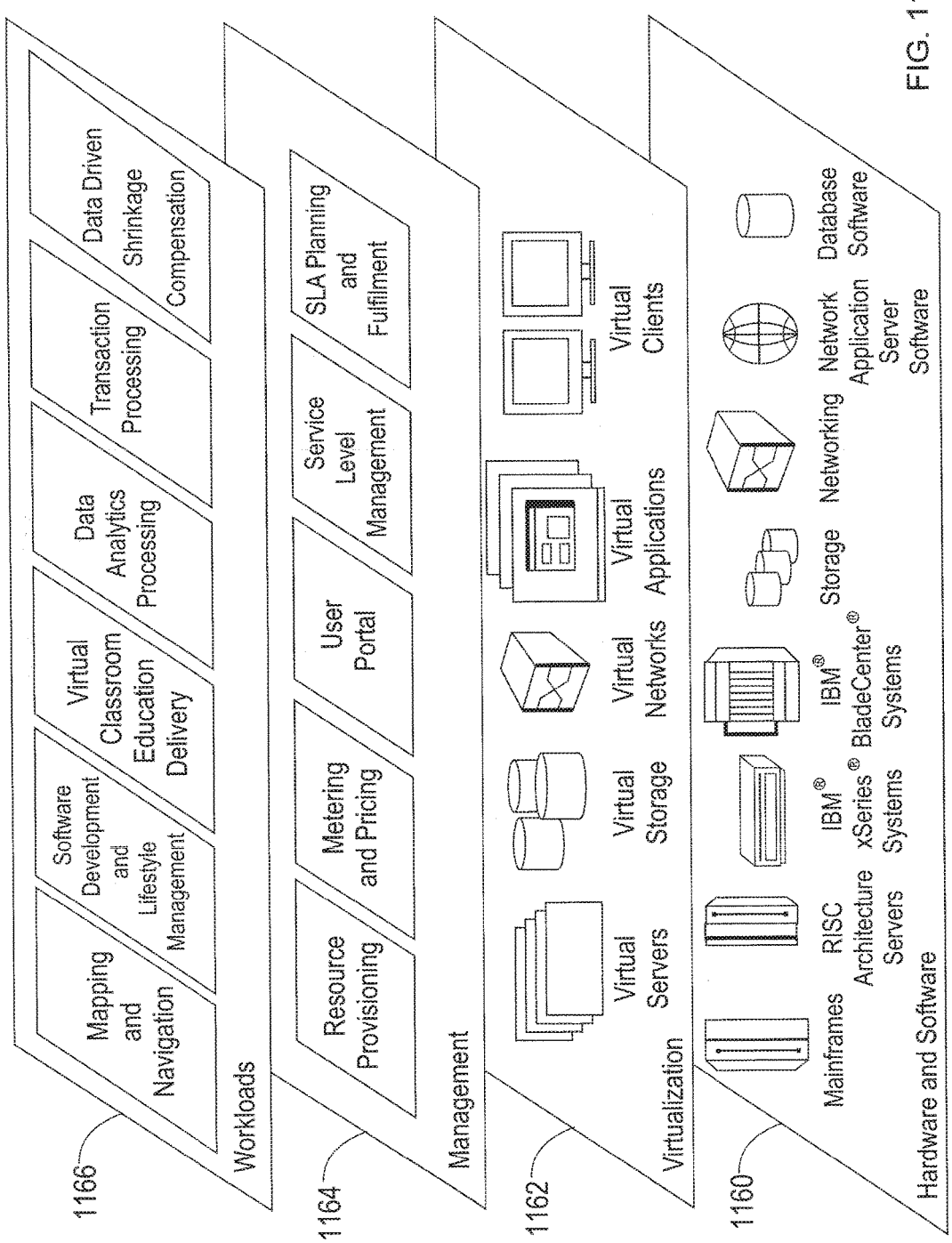
FIG. 11 shows exemplary abstraction model layers, in accordance with an embodiment of the present principles.

Referring now to FIG. 11, a set of functional abstraction layers provided by cloud computing environment 1050 (FIG. 10) is shown. It should be understood in advance that the components, layers, and functions shown in FIG. 11 are intended to be illustrative only and embodiments of the invention are not limited thereto. As depicted, the following layers and corresponding functions are provided:

Hardware and software layer 1160 includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer 1162 provides an abstraction layer from which the following examples of virtual entities may be provided: virtual servers; virtual storage; virtual networks, including virtual private networks; virtual applications and operating systems; and virtual clients.

In one example, management layer 1164 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 1166 provides examples of functionality for which the cloud computing environment may be utilized. Examples of workloads and functions which may be provided from this layer include: mapping and navigation; software development and lifecycle management; virtual classroom education delivery; data analytics processing; transaction processing; and data driven shrinkage compensation.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for using data driven shrinkage compensation to fabricate an object using an additive manufacturing process, the method comprising:
   calculating, by at least one processor device operatively coupled to a memory device, one or more dimensions of an object modeled in a file from one or more directional strands disposed between facets of one or more respective predetermined facet pairs;
   predicting, by the at least one processor device, dimensional changes in the one or more directional strands as a result of the fabrication of the object using an additive manufacturing process based on a shape shrinkage model; and
   correcting, by the at least one processor device, coordinate data of at least one facet of the one or more predetermined facet pairs to compensate for the one or more predicted dimensional changes in the one or more directional strands.

2. The method of claim 1, wherein said correcting step corrects the coordinate data of both facets of at least one of the one or more predetermined facet pairs.

3. The method of claim 2, wherein said correcting step equally moves, by one half of a dimensional change, each of the facets of the at least one of the one or more predetermined facet pairs.

4. The method of claim 1, further comprising subdividing, by the at least one processor device, polygons in the file into the facets, the object being formed from at least some of the polygons.

5. The method of claim 4, wherein said subdividing step further subdivides the polygons into vertices, and the method further comprises:
   numbering each of the facets; and
   numbering the vertices of each of the facets such that a same respective number is assigned to a same respective coordinate of vertices.

6. The method of claim 5, further comprising:
   setting, by the at least one processor device, sampling points on the polygons;
   associating, by the at least one processor device, a facet number of a given facet with the coordinate data of a sampling point included in the given facet.

7. The method of claim 6, wherein the one or more directional strands are each calculated from a respective pair of opposing sampling points.

8. The method of claim 7, wherein:
   the one or more dimensions include first, second and third dimensions;
   the one or more directional strands include a first directional strand, a second directional strand and a third directional strand;
   the coordinate data includes first coordinate data, second coordinate data and third coordinate data; and
   a length of the first directional strand is calculated from the respective pair of opposing sampling points with a same second coordinate and third coordinate, a length of the second directional strand is calculated from the respective pair of opposing sampling points with a first coordinate and third coordinate, and a length of the third directional strand is calculated from the respective pair of opposing sampling points with a same first coordinate and second coordinate.

9. The method of claim 6, wherein the sampling points are set using a ray intersection technique or point-in-polygon technique.

10. The method of claim 1, further comprising deriving, by the at least one processor device, the shape shrinkage model from a test artifact, the test artifact having a plurality of shape variations.

11. The method of claim 10, wherein the shape shrinkage model is derived using at least one of a kernel regression technique, a neural network, and a deep learning technique.

12. The method of claim 10, wherein said deriving step further comprises:
   printing the test artifact using a three-dimensional printer;
   acquiring dimensions of the test artifact as point cloud data using a three-dimensional scanner;
   calculating, using the point cloud data, one or more dimensions of the test artifact from one or more directional strands disposed between facets of one or more respective predetermined facet pairs; and generating the shape shrinkage model from dimensional changes in any of the one or more directional strands.

13. A non-transitory article of manufacture tangibly embodying a computer readable program which when executed causes a computer to perform the steps of claim 1.

14. A system for using data driven shrinkage compensation to fabricate an object using an additive manufacturing process, the system comprising:
a memory device having program code stored thereon; and
at least one processor device operatively coupled to the memory device and configured to execute program code stored on the memory device to:
calculate one or more dimensions of an object in a file from one or more directional strands disposed between facets of one or more respective predetermined facet pairs;
predict dimensional changes in the one or more directional strands as a result of the fabrication of the object using an additive manufacturing process based on a shape shrinkage model; and
correct coordinate data of at least one facet of the one or more predetermined facet pairs to compensate for the one or more dimensional changes in the one or more directional strands.

15. The system of claim 14, wherein said correction corrects the coordinate data of both facets of at least one of the one or more predetermined facet pairs.

16. The system of claim 15, wherein said correction equally moves, by one half of a dimensional change, each of the facets of the at least one of the one or more predetermined facet pairs.

17. The system of claim 14, wherein said at least one processor device is further configured to execute program instructions stored on the memory device to:
subdivide polygons in the file into the facets, the three-dimensional object being formed from at least some of the polygons;
subdivide the polygons into vertices;
number each of the facets; and
number the vertices of each of the facets such that a same respective number is assigned to a same respective coordinate of vertices.

18. The system of claim 14, wherein:
the one or more dimensions include a first dimension, a second dimension and a third dimension;
the one or more directional strands include a first directional strand, a second directional strand and a third directional strand;
the coordinate data includes first coordinate data, second coordinate data and third coordinate data; and
a length of the first directional strand is calculated from a respective pair of opposing sampling points with a same second coordinate and third coordinate, wherein a length of the second directional strand is calculated from a respective pair of opposing sampling points with a same first coordinate and third coordinate, and wherein a length of the third directional strand is calculated from a respective pair of opposing sampling points with a same first coordinate and second coordinate.

19. The system of claim 14, wherein the at least one processor device is further configured to execute program instructions stored on the memory device to derive the shape shrinkage model from a test artifact, the test artifact having a plurality of shape variations.

20. The system of claim 19, wherein the shape shrinkage model is derived using at least one of a kernel regression technique, a neural network, and a deep learning technique.

* * * * *